United States Patent
Choudhary et al.

(10) Patent No.: US 12,374,725 B2
(45) Date of Patent: Jul. 29, 2025

(54) BATTERY MANAGEMENT SYSTEM FOR MONITORING A BATTERY STATUS

(71) Applicant: ZEBRA TECHNOLOGIES CORPORATION, Lincolnshire, IL (US)

(72) Inventors: Mukesh V. Choudhary, Navi Mumbai (IN); Ajay Sood, Bangalore (IN); Charles W. Roark, Frisco, TX (US)

(73) Assignee: Zebra Technologies Corporation, Lincolnshire, IL (US)

( * ) Notice: Subject to any disclaimer, the term of this patent is extended or adjusted under 35 U.S.C. 154(b) by 343 days.

(21) Appl. No.: 17/199,681

(22) Filed: Mar. 12, 2021

(65) Prior Publication Data

US 2022/0294027 A1  Sep. 15, 2022

(51) Int. Cl.
*H01M 10/42* (2006.01)
*G01R 31/392* (2019.01)
(Continued)

(52) U.S. Cl.
CPC ........ *H01M 10/425* (2013.01); *G01R 31/396* (2019.01); *H01M 10/4207* (2013.01);
(Continued)

(58) Field of Classification Search
CPC ........... H01M 10/425; H01M 10/4207; H01M 10/482; H01M 2010/4271; G01R 31/396;
(Continued)

(56) References Cited

U.S. PATENT DOCUMENTS

2013/0268223 A1\* 10/2013 Plestid ................. G01R 31/382
702/63
2015/0046109 A1\* 2/2015 Miwa ................... H01M 10/482
702/63

(Continued)

FOREIGN PATENT DOCUMENTS

JP  20160067559 A  \*  6/2016
JP  6165620 B2  \*  7/2017
(Continued)

OTHER PUBLICATIONS

English translation of WO 2020152901, Jul. 30, 2020. (Year: 2020).\*

(Continued)

*Primary Examiner* — Michael P Nghiem (57) ABSTRACT

A battery management system is disclosed herein. The battery management system may monitor a charge cycle of a battery. The battery management system may determine a degradation rate of the battery. The battery management system may determine a usage pattern of the battery based on usage of the battery during a time period. The battery management system may determine, using a battery analysis model, a quantity of remaining charge cycles of the battery based on the degradation rate and the usage pattern. The battery analysis model may be trained based on historical data associated with historical usage of one or more other batteries. The battery management system may determine a status of the battery based on the quantity of remaining charge cycles and the degradation rate. The battery management system may perform, based on a time period associated with a remaining useful life, an action associated with the battery.

20 Claims, 6 Drawing Sheets

(51) Int. Cl.
    *G01R 31/396*     (2019.01)
    *H01M 10/48*     (2006.01)
    *H02J 7/00*     (2006.01)

(52) U.S. Cl.
    CPC ....... *H01M 10/482* (2013.01); *H02J 7/00036* (2020.01); *H01M 2010/4271* (2013.01)

(58) Field of Classification Search
    CPC .. G01R 31/392; H02J 7/00036; H02J 7/0047; H02J 7/005
    USPC .......................................................... 702/63
    See application file for complete search history.

(56) References Cited

U.S. PATENT DOCUMENTS

| | | | | |
|---|---|---|---|---|
| 2016/0190824 A1* | 6/2016 | Brackx | ............... | H02J 7/02 320/162 |
| 2019/0361077 A1* | 11/2019 | Shimonishi | ......... | H01M 10/425 |
| 2019/0366865 A1* | 12/2019 | Morimoto | ............. | B60L 3/0069 |
| 2019/0379030 A1* | 12/2019 | Golubkov | ............. | B60L 3/0046 |
| 2020/0292620 A1* | 9/2020 | Takahashi | ............ | G01R 31/392 |
| 2020/0355750 A1* | 11/2020 | Badwekar | .......... | G01R 31/367 |
| 2021/0057920 A1* | 2/2021 | Husain | ...................... | H02J 7/24 |
| 2021/0291687 A1* | 9/2021 | Ferguson | ............. | G05D 1/0083 |
| 2022/0120821 A1* | 4/2022 | Ruan | .................. | G01R 31/3648 |
| 2022/0161944 A1* | 5/2022 | Rhoads | ................ | H04B 7/1851 |
| 2022/0373607 A1* | 11/2022 | Kim | .................... | H01M 10/425 |
| 2023/0243893 A1* | 8/2023 | Shiraga | ................ | H01M 10/48 702/63 |
| 2023/0333166 A1* | 10/2023 | Jindal | .................. | G01R 31/392 |

FOREIGN PATENT DOCUMENTS

| | | | | |
|---|---|---|---|---|
| WO | WO-2020152901 A1 * | 7/2020 | ........ | G01R 31/3842 |
| WO | WO-2022047204 A9 * | 4/2022 | | |

OTHER PUBLICATIONS

English translation of JP 6165620, Jul. 19, 2017. (Year: 2017).*
English translation of KR 20160067559, Jun. 14, 2016. (Year: 2016).*

* cited by examiner

BATTERY MANAGEMENT SYSTEM FOR MONITORING A BATTERY STATUS

BACKGROUND

A system, such as a user device, a server device, or a group of devices may rely on a battery to store and supply power to components and/or devices of the systems. To maintain operations of a system, the battery may need to be replaced at the end of a useful life of the battery, otherwise the system may be rendered inoperable. Therefore, there is a need to determine or predict a remaining useful life of a battery.

SUMMARY

In some implementations, a method for providing a status of a battery for a system includes receiving a charge count associated with a charge cycle of a battery; detecting a completion of the charge cycle based on the charge count indicating that the battery has been charged according to a rated capacity of the battery; determining, by the device and based on detecting the completion of the charge cycle, a degradation rate of the battery relative to a previous charge cycle of the battery; determining a usage pattern of the battery based on usage of the battery during a time period; determining, by the device and using a battery analysis model, a quantity of remaining charge cycles of the battery based on the degradation rate and the usage pattern, wherein the battery analysis model is trained based on historical data associated with historical usage of one or more other batteries; determining the status of the battery based on the quantity of remaining charge cycles and the degradation rate, wherein the status is associated with a remaining useful life of the battery; and transmitting, to a user device, the status of the battery to indicate the remaining useful life to a user.

In some implementations, a device includes one or more memories; and one or more processors, communicatively coupled to the one or more memories, configured to: monitor a charge cycle of a battery; determine, based on a completion of the charge cycle, a degradation rate of the battery; determine a usage pattern of the battery based on usage of the battery during a time period; determine, using a battery analysis model, a quantity of remaining charge cycles of the battery based on the degradation rate and the usage pattern, wherein the battery analysis model is trained based on historical data associated with historical usage of one or more other batteries; determine a status of the battery based on the quantity of remaining charge cycles and the degradation rate, wherein the status is associated with a remaining useful life of the battery; and perform, based on a time period associated with the remaining useful life, an action associated with the battery.

In some implementations, a tangible machine-readable medium storing a set of instructions includes one or more instructions that, when executed by one or more processors of a device, cause the device to: generate a battery analysis model based on historical data associated with historical usage of a plurality of batteries; train the battery analysis model using a machine learning technique; monitor usage of a battery and charging of the battery, wherein the battery is associated with one or more batteries of the plurality of batteries; determine, after a completion of charge cycle, a degradation rate of the battery; determine, based on the completion of the charge cycle, a usage pattern associated the usage of the battery during a time period; cause the battery analysis model to determine, based on the usage pattern and the degradation rate, a quantity of remaining charge cycles of the battery; and perform an action based on the quantity of remaining charge cycles.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate implementations of concepts disclosed herein, and explain various principles and advantages of those implementations.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of implementations described herein.

The apparatus and method elements have been represented where appropriate by conventional symbols in the drawings, showing only those specific details that are pertinent to understanding the implementations described herein so as not to obscure the disclosure with details that will be readily apparent to those of ordinary skill in the art having the benefit of the description herein.

DETAILED DESCRIPTION

The following detailed description of example implementations refers to the accompanying drawings. The same reference numbers in different drawings may identify the same or similar elements.

A battery, which may include one or more cells, typically degrades over a period of use. In many cases, use of a battery is rated as reliable (e.g., at the time of manufacture) until the battery reaches some fixed charge-related threshold. For example, the battery may reach the end of the battery's useful life when the battery cannot receive or hold a charge above a threshold percentage of a rated capacity of the battery. Additionally, or alternatively, the battery may be considered to have reached the end of the battery's useful life after undergoing a threshold quantity of charge cycles. In such cases, while the battery may capable of continuing to power a device for some period of time beyond the fixed threshold, at such a point, the degradation rate of the battery may relatively quickly increase and/or the reliability of the battery may relatively quickly decrease. Accordingly, such fixed thresholds are typically used to determine when a battery is to be replaced (e.g., to prevent or reduce the probability of the battery and/or a device that relies on power from the battery from becoming inoperable). However, various circumstances or conditions of a battery (e.g., usage patterns, environmental conditions and/or operating conditions, and/or charge cycles) affect the duration of time until the battery's useful life expires.

A system may include multiple devices (e.g., hundreds, thousands, or more), each powered by separate batteries (which may or may not be the same type) under different conditions. Accordingly, individual batteries may degrade at various rates and/or be used in various ways. Periodic or ad hoc battery services (e.g., status checks, maintenance, and/or replacements) can be performed on a device to prevent the system and/or the device from being rendered inoperable due to the expiration of a battery. However, such battery services may be inefficient and/or ineffective. For example, performing battery maintenance too frequently on a device (e.g., when the device's battery still has plenty of remaining useful life) may result in unnecessary downtime of the device, resulting inefficient use of the device and/or inefficient performance of a system. On the other hand, if such battery services are not performed on the device frequently enough, the useful life of the battery may expire between battery services, and, correspondingly, the battery, the device, and/or the system may experience a failure, which may also result in downtime of the system. Accordingly, there is a need to individually monitor the status of multiple batteries in a system to accurately determine a remaining useful life for one or more of the batteries to prevent the system and/or one or more of the devices from being rendered inoperable due to battery failure or inoperability.

Some implementations described herein provide a battery management system that monitors the status of a battery (and multiple other batteries) in a system to determine a remaining useful life of the battery. As described herein, the battery management system may be configured to receive battery information from the battery and/or a system associated with the battery. The battery management system may determine the remaining useful life based on monitoring a degradation rate of the battery (e.g., based on changes in capacity across different charge cycles), monitoring a usage pattern of the battery, and using a battery analysis model to determine a number of remaining charge cycles based on the degradation rate and the usage pattern. The battery analysis model may include a machine learning model, such as a clustering model and/or a linear regression model, that is generated and/or trained based on historical battery data. The historical battery data may include historical usage of batteries (e.g., that are a same type of the battery) and/or historical conditions under which the batteries were used. Accordingly, the battery analysis model may be trained to determine the remaining charge cycles based on the usage pattern of the battery, the degradation rate of the battery, and/or the operating conditions of the battery.

In this way, the battery management system may individually monitor the status of the batteries to permit the battery management system to determine and/or indicate a remaining useful life of the battery. The remaining useful life may correspond to a time period (e.g., a number of hours, days, weeks, months, years, and so on) until the battery is expected to reach a particular threshold at which point the battery is deemed unreliable for use. Accordingly, as described herein, the battery management system may permit the battery, the system, and/or a user associated with the system to proactively replace the battery to prevent (or at least reduce a probability of) the battery from causing a shutdown of the system and/or preventing a device of the system from being incapable of operating as desired or configured (e.g., due to lack of reliable power from the battery).

Figure 1:
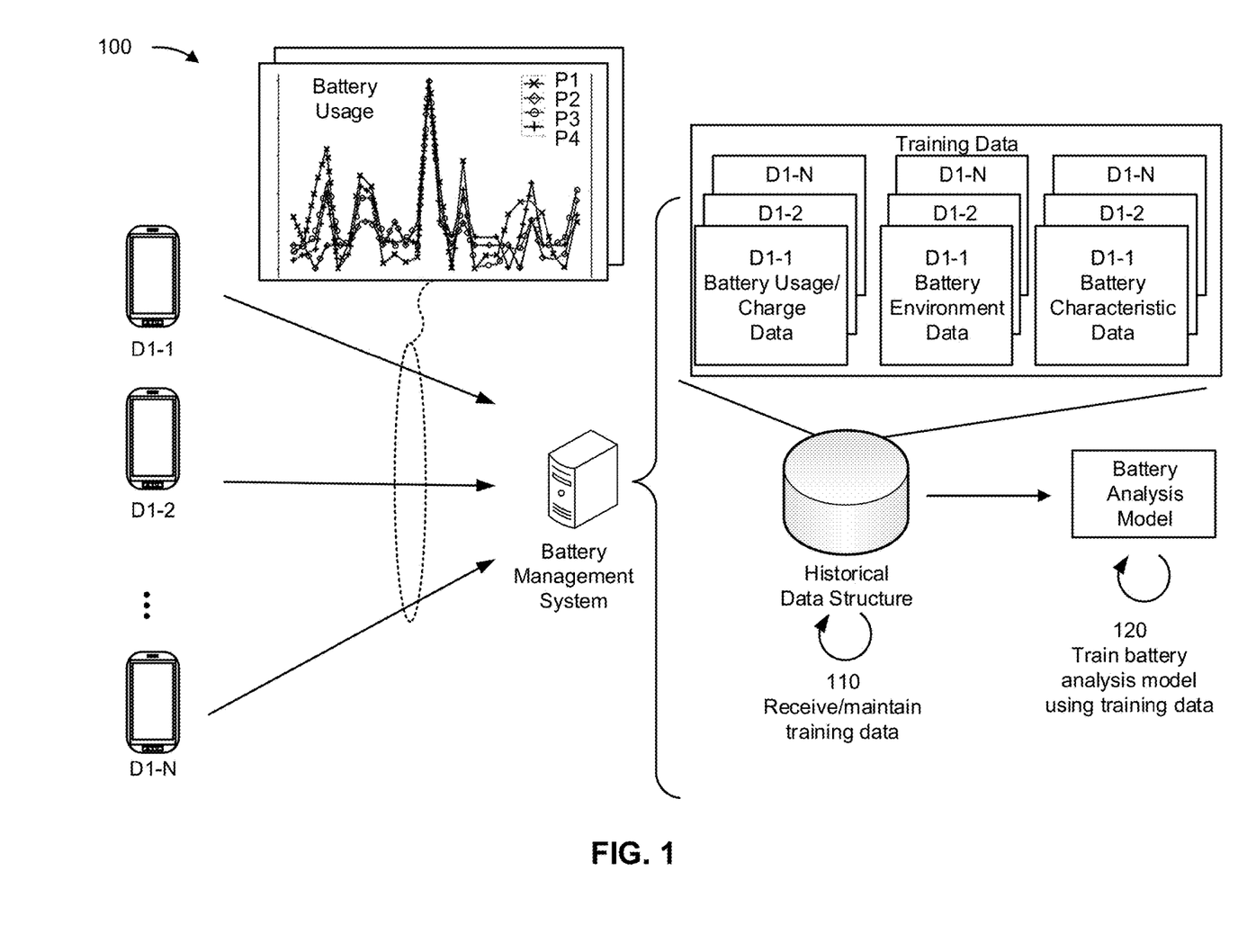
FIG. 1 is a diagram of an example implementation associated with a battery management system for monitoring a battery status, as described herein.
Figure 2:
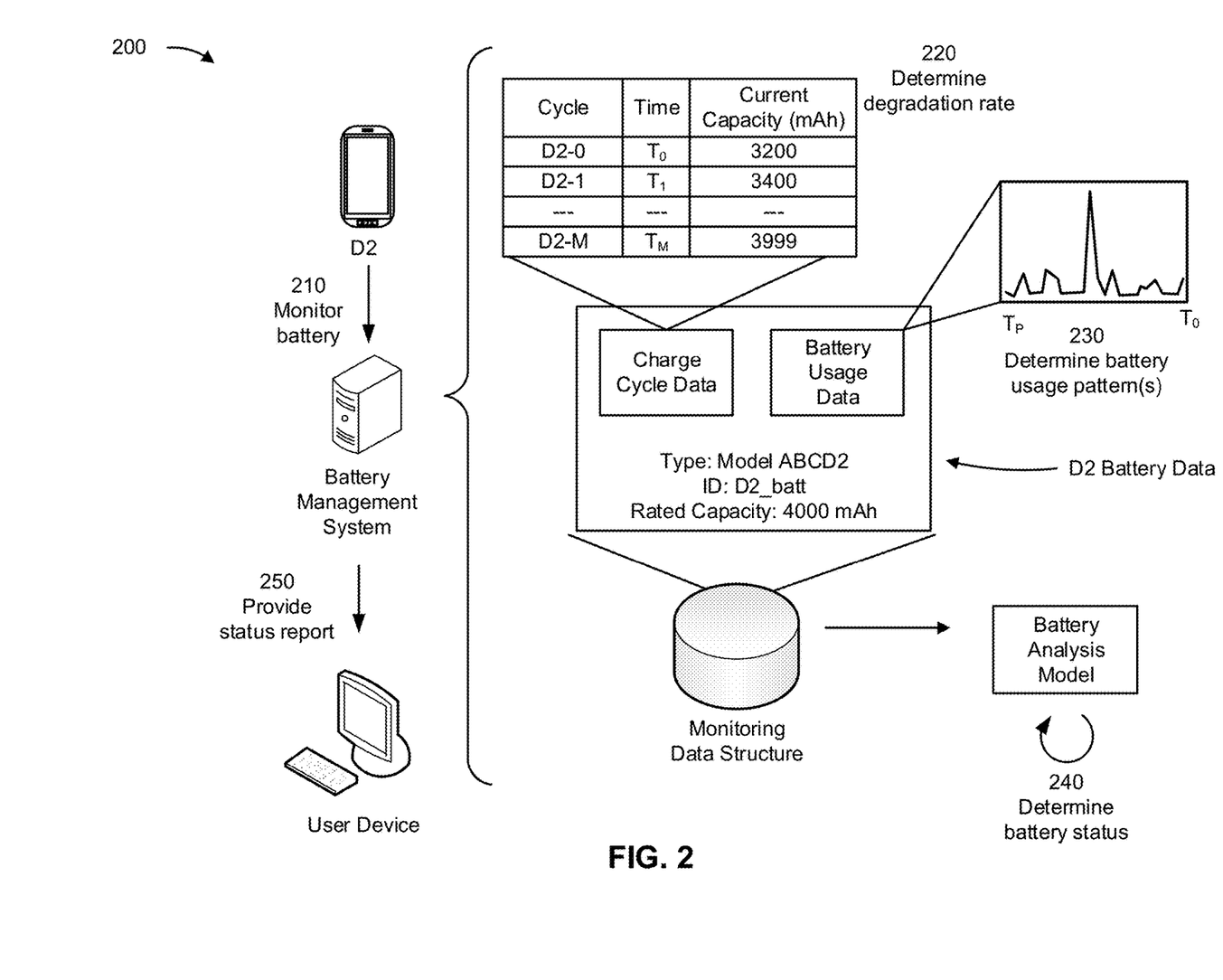
FIG. 2 is a diagram of an example implementation associated with monitoring a battery status as described herein.
Figure 3:
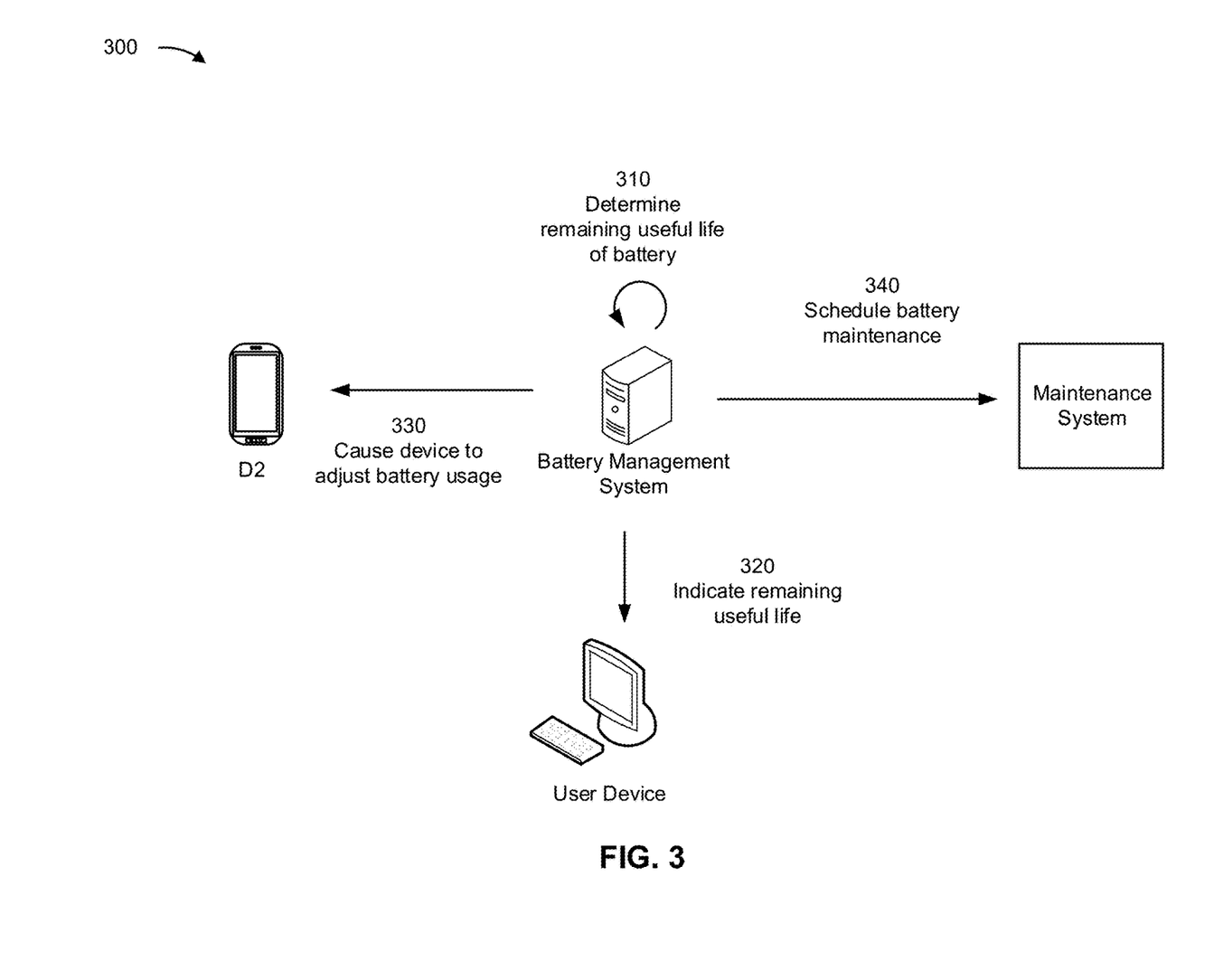
FIG. 3 is a diagram of an example implementation described herein.

FIGS. 1-3 are diagrams of one or more example implementations associated with a battery management system for monitoring a battery status. The devices of FIGS. 1-3 are described in more detail below in connection with FIG. 4 and FIG. 5.

As shown in FIG. 1, an example implementation 100 includes multiple system devices (shown as D1-1, D1-2, to D1-N) and a battery management system. The battery management system includes a historical data structure and a battery analysis model. In example implementation 100, the battery analysis model is developed (e.g., generated and/or trained) based on historical data associated with batteries of the system devices to permit the battery management system to monitor and/or determine the status of a battery, as described in connection with FIG. 2 and/or FIG. 3.

The system devices may be any suitable battery-powered device. Accordingly, the system devices may be a same type of device or different types of devices. Additionally, or alternatively, the system devices may be configured to use a same type of battery or different types of battery. For example, a type of a battery (and/or a battery pack that includes the battery) may correspond to a make and model of a battery, a mechanical configuration of a battery pack of the battery (e.g., a mechanical design or arrangement that enables the battery to mate or connect to a same type of device), an electrical configuration of the battery (e.g., an electrical assembly that is configured to receive or maintain a particular rated charge), and/or a hardware configuration of the battery (e.g., an arrange of particular material or set of materials). Accordingly, a battery may have a same type as another battery if both batteries (or battery packs of the batteries) are a same make and model, if both batteries have a same mechanical configuration, and/or if both batteries have a same electrical configuration. The system devices may be associated with a same system (e.g., a system configured to utilize the battery management system to monitor battery statuses of batteries utilized within the system) and/or various other systems.

As shown in FIG. 1, and by reference number 110, the battery management system receives and/or maintains training data for training the battery analysis model. For example, the battery management system may store the training data within a historical data structure. The historical data structure may include any suitable data structure, such as a database, an index, a graph, and/or the like. The training data may correspond to historical data that is collected and/or received from the system devices during a training period involved in developing and/or generating the battery analysis model. The battery management system may be configured to collect and/or receive training data from the system devices periodically, according to a schedule, and/or based on an event (e.g., an end of a charge cycle of a battery). Accordingly, the system devices may be configured to provide the training data (e.g., over the course of normal use and/or to facilitate training of the battery analysis model, as described herein).

The training data may include battery usage/charge data that is associated with usage of the batteries of the system devices during the training period and/or charge cycles of the batteries during the time period. For example, the battery usage/charge data may identify usage rates and/or usage patterns (e.g., usage rates over a time period) of the batteries of the system devices. Additionally, or alternatively, the battery usage/charge data may identify charge cycles and/or characteristics of the batteries relative to the charge cycles. For example, such characteristics may include a maximum charge capacity associated with a charge cycle (e.g., a maximum amount of charge, in milliampere hours (mAh), received or counted during the charge cycle). Correspondingly, the battery usage/charge data may indicate degradation rates (e.g., historical degradation rates) of the batteries during the time periods.

The training data may include battery environment data that indicates and/or is representative of one or more operating conditions (e.g., historical operating conditions during the training period) of the system devices and/or the batteries. For example, the one or more operating conditions may include a location of a system device (and/or a battery) and/or a temperature associated with the system device (e.g., an operating temperature and/or a temperature of a physical environment of the system device). Additionally, or alternatively, the battery environment data may identify a type of operation or entity (e.g., an organization or individual) associated with the system device. In such cases, the type of operation and/or entity may represent the type of operating conditions under which the system devices were operating during a training period. For example, if the type of operation indicates a construction operation, the type of operating condition may be indicated as relatively harsh (e.g., due to be susceptible to frequent movement, impact, harsh climate conditions, and/or the like) compared to a type of operation that indicates usage in an office environment (which is typically climate controlled and relatively less susceptible to harsh conditions).

The training data may include battery characteristic data that identifies one or more characteristics of the battery. For example, the characteristics of the battery may include an identifier of the battery, a type of the battery, and/or a specification of the battery (e.g., a rated capacity and/or a useful life threshold, such as a threshold health score and/or a quantity of charge cycles). In some implementations, the battery characteristic data may be indicated by the system device (e.g., via an application of the sensor data that is used to train the battery analysis model) and/or via a user input (e.g., in association with a supervised learning technique).

In this way, the training data may include respective records of the batteries and/or the devices. For example, as shown, first battery usage/charge data, first battery environment data, and first battery characteristic data may be included for a first system device (D1-1), second battery usage/charge data, second battery environment data, and second battery characteristic data may be included for a second system device (D1-2), and so on.

As further shown in FIG. 1, and by reference number 120, the battery management system trains the battery analysis model using the training data. For example, the battery analysis model may train the battery analysis model based on the training data received and/or collected from the system devices during the training period. The battery management system may train the battery analysis model once a sufficient amount of training data is obtained to train the battery analysis model to determine a status of a battery, as described herein, with a threshold (or desired) level of confidence.

The battery analysis model may include or be associated with a machine learning model (e.g., a linear regression model, a bucketing/clustering model, a prediction model, a generator model, and/or a neural network). For example, the battery analysis model may include and/or utilize a machine learning technique to classify the training data into the buckets. More specifically, the battery management system may use a bucketing technique and/or a linear regression technique to classify the training data (e.g., data associated with a particular battery type) into buckets associated with particular classes. For example, the battery analysis model may be configured to classify the training data into a class indicating a relatively fast degradation rate of the batteries during the training period, a class indicating a relatively intermediate degradation rate of the batteries during the training period, and a class indicating a relatively slow degradation rate of the batteries during the training period.

The machine learning model of the battery analysis model may be trained to identify remaining charge cycles of a battery. For example, for a battery type, the battery management system may train the machine learning model based on the battery usage/charge data and/or the battery environment data. In some implementations, the battery analysis model may be trained to identify patterns and/or trends involving a degradation rate (or a range of degradation rates) and a particular usage pattern being indicative of a quantity (or range) of remaining charge cycles of a battery. Additionally, or alternatively, the battery analysis model may be trained to identify patterns or trends involving a degradation rate and a particular operating condition being indicative of a quantity (or range) of remaining charge cycles. Accordingly, the battery analysis model may learn, maintain, and/or associate similar usage patterns (e.g., usage patterns that are determined to be within a threshold degree of similarity as determined by a similarity analysis or a classification technique) and a corresponding degradation rate (e.g., an average or weighted average of degradation rates associated with the similar usage patterns), similar operating conditions (e.g., operating conditions that are determined to be within a threshold degree of similarity) and a corresponding degradation rate, and/or similar usage patterns and corresponding similar operating conditions.

In some implementations, the battery management system may receive the operation performance model from another system after the battery management system is trained. For example, the other system may obtain the training data (and/or similar training data) and provide the battery analysis model to the battery management system to permit the battery management system to utilize the battery analysis model, as described herein. Additionally, or alternatively, the battery analysis model may be configured to be locally installed on a system device for use, as described herein.

In example implementation 200 of FIG. 2, the battery management system uses the battery analysis model to determine a status of a battery as described herein. In FIG. 2, example implementation 200 includes the battery management system, a system device (shown as D2), and a user device. The system device may correspond to and/or be associated with one or more of the system devices of example implementation 100. The system device may be any suitable type of device that is configured to receive power from a battery that is monitored by the battery management system, as described herein. As shown in FIG. 2, the battery management system includes a monitoring data structure and the battery analysis model. The monitoring data structure may include entries associated with batteries that are monitored by the battery management system. For example, as shown, the monitoring data structure includes an entry that stores battery data associated with the system device (shown as D2 Battery Data), including a type of the battery (shown as Model ABCD2), an identifier of the battery (shown as D2_batt), and a rated capacity of the battery (4000 mAh).

As shown in FIG. 2, and by reference number 210, the battery management system monitors a battery of a system device. For example, the system device may provide battery information to the battery management system via a network or a communication link between the battery management system and the system device. The battery information may include and/or identify charge information associated with one or more charge cycles of the battery of the and/or usage information associated with the battery. The charge information and/or the usage information may be associated with a previous time period, such as a sliding window (e.g., a fixed time period) and/or a time period that is between a previous most recent communication of the battery information and the current communication of the battery information. Accordingly, the battery management system may monitor the battery based on receiving the battery information from the system device.

In some implementations, the battery management system may receive the battery information based on a completion of a charge cycle of the battery. The battery information may indicate a quantity of charge cycles that have occurred over the use of the battery. Correspondingly, the battery information may indicate that a charge cycle has completed based on the quantity of charge cycles increasing since a previous communication from the system device (e.g., a communication that indicated a last known quantity of completed charge cycles). In some implementations, the battery management system may monitor the battery based on receiving, from the system device and/or the battery, a count from a counter of the battery. For example, the counter may be associated with a controller of a battery pack of the battery that controls power output from the battery. The counter (and/or the controller) of the battery may be configured to count and/or indicate a count of a charge cycle. For example, the counter may be configured to count an amount of energy (e.g., in mAh) that is received and/or maintained by the battery during a time period. A charge cycle may correspond to an amount of charge being provided to the battery that corresponds to the rated capacity of the battery. For example, a charge cycle for the battery of the system device, with a 4000 mAh rated capacity, would be completed each time 4000 mAh are provided to the battery. Accordingly, a charge cycle may involve multiple charge events, during which the battery is receiving a charge. For example, referring to the 4000 mAh rated capacity example, a first event may involve charging the battery with 1500 mAh, after which the battery shows a 80% of current capacity, and the battery is used for a period of time. Following the period of time, a second charging event may involve charging the battery with 2500 mAh, after which the battery shows a 65% of current capacity and the charge cycle is complete (1500 mAh+2500 mAh=4000 mAh). In this way, based on receiving the count from the counter, the battery management system may monitor and/or detect completion of a charge cycle.

In some implementations, based on detecting completion of the charge cycle, the battery management system may receive and/or collect other battery information associated with the battery. For example, the battery information may include a current capacity of the battery (e.g., as measured or determined at the completion of the charge cycle and/or at any other time during a charge cycle). The battery information may include and/or indicate a usage pattern of the battery during a time period (e.g., the time period associated with the battery information). The battery information may indicate the type of the battery utilized by the system device and/or other characteristics of the battery. In some implementations, the battery information indicates environmental information associated with the system device. The environmental information may indicate an operating condition of the system device and/or the battery, such as a location of the system device, a temperature associated with usage of the battery, and other operating conditions involving an environment of the system device.

As further shown in FIG. 2, and by reference number 220, the battery management system determines the degradation rate of the battery. The battery management system may determine the degradation rate of the battery based on detecting the completion of the charge cycle (e.g., according to the battery information and/or the count indicated by the counter of the battery). For example, as shown, the battery management system may maintain and/or store charge cycle data for the battery within the monitoring data structure. The monitoring data structure may be any suitable data structure that maintains charge cycle information, including an identifier of the charge cycle, a time of the charge cycle, and an amount of energy (e.g., an amount of mAh) of the charge cycle. Accordingly, for charge cycle D2-0, which may be a most recent charge cycle, the monitoring data structure stores the time of charge cycle D2-0 which occurred at time $T_0$ (e.g., a time at which the charge cycle D2-0 was completed), and 3200 mAh as the current capacity (and/or the amount of energy provided during the charge cycle).

The degradation rate may correspond to a reduction in a health score of the battery. The health score may correspond to a ratio of the current charge capacity of the battery to the rated charge capacity of the battery (e.g., a percentage of the rated charge capacity that corresponds to the current charge capacity). The battery management system may determine and/or identify the health score of the battery at the completion of the charge cycle. In some implementations, the battery management system may track the health score associated with previous charge cycles. Correspondingly, the battery management system may determine the change in the health score based on a previous health score (e.g., a previous maximum charge capacity) associated with a previous charge cycle (e.g., one D2-1 to D2-M, where M is a quantity of previous charge cycles). The battery management system may determine the degradation rate based on a difference between the previous health score and the health score.

As further shown in FIG. 2, and by reference number 230, the battery management system determines the usage pattern of the battery. In some implementations, the battery management system may determine a usage pattern of the usage of the battery based on aggregating previously received usage information from the system device with the received usage pattern in the battery information. For example, as shown, the battery management system may store battery usage data of the battery in the monitoring data structure. As shown, a battery usage pattern of the battery between a time $T_p$ and time $T_0$ may be maintained. The time $T_p$ may correspond to the beginning of a sliding window (e.g., associated with a fixed most recent period of time) and/or a time associated with a completion of previous charge (e.g., one D2-1 to D2-M). Additionally, or alternatively, the battery management system may identify the usage pattern from the received battery information and/or an indication of the usage pattern from the system device.

As further shown in FIG. 2, and by reference number 240, the battery management system determines the battery status. The battery management system may use the battery analysis model to determine the battery status based on the usage pattern and/or the degradation rate of the battery. For example, the battery status may be representative of the state of the battery relative to usage of the battery, a degradation rate of the battery (e.g., over the course of a set of charge cycles), and a corresponding quantity of remaining charge cycles, as described herein.

As described herein, the battery analysis model is trained based on historical data associated with usage of batteries, historical operating conditions of the batteries, and/or historical degradation rates of the batteries. Accordingly, the battery analysis model may be configured to determine the quantity of remaining charge cycles based on historical data that is associated with one or more batteries that are the same or similar to the battery of the system device (e.g., are a same type of battery), that have a same or similar usage pattern, and/or that operated under a similar operating condition as the system device. Accordingly, rather than using a fixed threshold of charge cycles to determine a quantity of remaining charge cycles (e.g., by subtracting a total number of charge cycles over the life of the battery from the fixed threshold of charge cycles), the battery management system and/or battery analysis model may dynamically determine a remaining quantity of charge cycles that is specific to unique usage of the battery and based on the degradation rate (e.g., recent degradation rate), and/or the change in the degradation rate (e.g., over a time period) of the battery over a period of time. In this way, the battery management system and/or the battery analysis model may more accurately determine the quantity of remaining charge cycles of the battery relative to other systems that utilize a fixed quantity of charge cycles as threshold to track the quantity of remaining charge cycles for the battery.

As further shown in FIG. 2, and by reference number 250, the battery management system provides a report to the user device. For example, the battery management system may generate a status report that indicates the status of the battery. More specifically, the report may indicate the charge cycle data, the usage pattern, the quantity of remaining charge cycles and/or the like. The user device may be associated with a user (e.g., a supervisor or manager of the system) that monitors the status of the batteries in the system.

In some implementations, as described herein, the status report may indicate a remaining useful life of the battery. For example, the battery management system and/or the battery analysis model may determine the remaining useful life based on the quantity of remaining charge cycles and the usage pattern. More specifically, the from the usage pattern, the battery management system may determine (or predict) an amount of charge cycles needed during a future time period (e.g., by propagating the usage pattern into the future time period). For example, if the battery management system determines that the quantity of remaining charge cycles is ten, the battery management system may determine that the remaining useful life is relatively shorter (e.g., less than one week) if a usage pattern indicates a relatively high amount of usage during a recent time period. On the other hand, in such an example, if the usage pattern indicates a relatively low amount of usage during the recent time period, the battery management system may determine that the remaining useful life is relatively longer (e.g., longer than one week). Accordingly, based on the usage pattern, the degradation rate, and the quantity of remaining charge cycles, the battery management system and/or the battery analysis model can predict a time period associated with expiration of the useful life of the battery by inferring that the usage pattern is relatively maintained (or altered according to an estimation learned from the historical data).

In some implementations, the battery management system may send the report to the user device based on the quantity of charge cycles being below a threshold quantity. For example, the battery management system may provide the status report to the user device to prompt the user to replace (or at least service) a battery that potentially may experience a failure and/or that may cause the system device or the system to shut down. The threshold quantity of remaining charge cycles may be configured according to any suitable technique and/or based on any suitable metric (e.g., a user input that is based on an ability of the user to replace the battery and/or an ability of a maintenance system to facilitate replacement of the battery).

In example implementation 300 of FIG. 3, the battery management system may perform one or more actions based on the status of the battery. In FIG. 3, example implementation 300 includes the battery management system, the system device (D2), the user device, and a maintenance system. As shown in FIG. 3, and by reference number 310, the battery management system determines a remaining useful life, as described herein.

As further shown in FIG. 3, and by reference number 320, the battery management system indicates the remaining useful life to the user device. For example, the battery management system may indicate the remaining useful life to the user device via a status report, as described above. Additionally, or alternatively, the battery management system may transmit a message or notification that causes the user device to prompt or alert the user of the remaining useful life of the battery. In some implementations, the battery management system may indicate the remaining useful life to the user device based on the remaining useful life being shorter than a threshold time period. The duration of the threshold time period may be configured according to any suitable technique and/or based on any suitable metric. The battery management system may similarly indicate the remaining useful life to the system device (e.g., to permit a user of the system device to view or access the remaining useful life of the system device).

In some implementations, the battery management system may indicate, based on the remaining useful life, whether the battery should be serviced and/or removed from service (e.g., disposed of). For example, the status report may indicate that a battery should be removed from service based on the remaining useful life indicating a probability that the battery is not likely to survive an operation of the system device or a time period until the battery can be replaced during subsequent maintenance on the system device and/or the battery.

As further shown in FIG. 3, and by reference number 330, the battery management system causes the system device to adjust battery usage. For example, based on the remaining useful life being below a threshold (e.g., a threshold that may indicate that the remaining useful life of the battery may expire before the battery is replaced), the battery management system may transmit instructions to the system device to alter usage of the battery to extend a duration of the remaining useful life of the battery relative to proceeding to continue to use the battery according to the usage pattern. For example, the system device may enter a low-power mode and/or a power-saving mode that reduces consumption of power from the battery (e.g., by dimming a display of the system device, by restricting or deactivating certain processes or communication capabilities, and/or the like). In this way, the battery management system may prevent a shutdown or failure of the system device and/or the system by extending the remaining useful life of the battery.

As further shown in FIG. 3, and by reference number 340, the battery management system may schedule maintenance of the battery via the maintenance system. The maintenance system may include a scheduling platform and/or a maintenance control platform that facilitates maintenance of the batteries and/or the system devices of the system. Accordingly, the battery management system may cause the maintenance system to service the battery by scheduling a replacement of the battery at a time that is before the expiration of the remaining useful life (e.g., via a calendar system associated with a user and/or a machine used to replace the batteries). Additionally, or alternatively, the battery management system may cause the maintenance system to automatically replace or service the battery prior to the expiration of the remaining useful life.

In this way, as described herein, the battery management system utilizes a battery analysis model to monitor and/or determine a status of a battery and maintain operations of a system based on the status of the battery. The battery analysis model, generated and trained as described herein, permits the battery management system to dynamically and accurately determine a quantity of remaining charge cycles of a battery and/or a remaining useful life of a battery based on unique and specific information associated with the battery. Accordingly, the battery management system may be configured to facilitate and maintain operations of a system device and/or a system by reducing or preventing shutdowns of the system device and/or system caused by battery failure and/or the expiration of the useful life of the battery.

As indicated above, FIGS. 1-3 are provided as one or more examples. Other examples may differ from what is described with regard to FIGS. 1-3. The number and arrangement of devices shown in FIGS. 1-3 are provided as an example. In practice, there may be additional devices, fewer devices, different devices, or differently arranged devices than those shown in FIGS. 1-3. Furthermore, two or more devices shown in FIGS. 1-3 may be implemented within a single device, or a single device shown in FIGS. 1-3 may be implemented as multiple, distributed devices. Additionally, or alternatively, a set of devices (e.g., one or more devices) shown in FIGS. 1-3 may perform one or more functions described as being performed by another set of devices shown in FIGS. 1-3.

Figure 4:
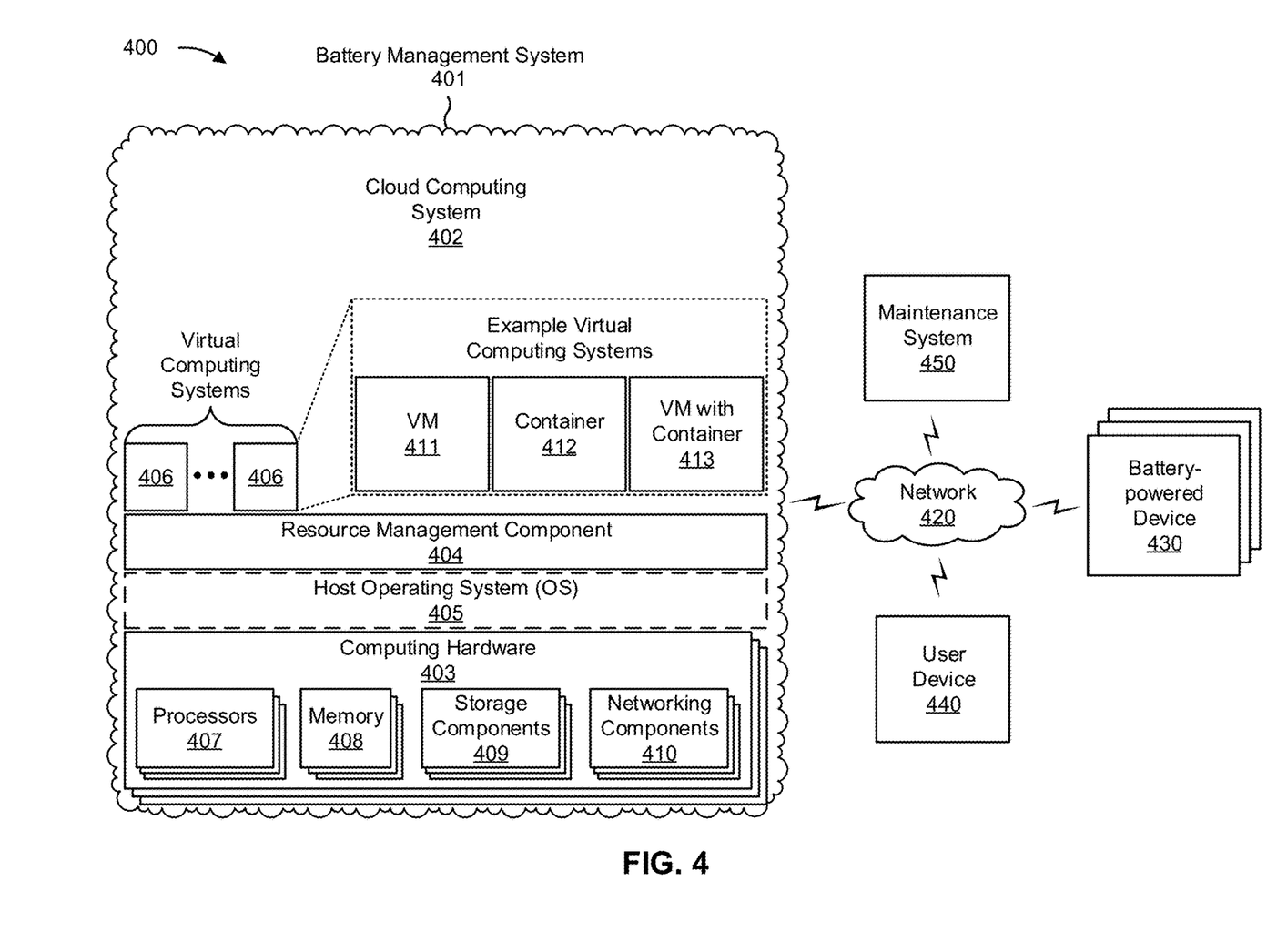
FIG. 4 is a diagram of an example environment in which systems and/or methods described herein may be implemented.

FIG. 4 is a diagram of an example environment 400 in which systems and/or methods described herein may be implemented. As shown in FIG. 4, environment 400 may include a battery management system 401, which may include one or more elements of and/or may execute within a cloud computing system 402. The cloud computing system 402 may include one or more elements 403-413, as described in more detail below. As further shown in FIG. 4, environment 400 may include a network 420, a battery-powered device 430, a user device 440, and/or a maintenance system 450. Devices and/or elements of environment 400 may interconnect via wired connections and/or wireless connections.

The cloud computing system 402 includes computing hardware 403, a resource management component 404, a host operating system (OS) 405, and/or one or more virtual computing systems 406. The resource management component 404 may perform virtualization (e.g., abstraction) of computing hardware 403 to create the one or more virtual computing systems 406. Using virtualization, the resource management component 404 enables a single computing device (e.g., a computer or a server) to operate like multiple computing devices, such as by creating multiple isolated virtual computing systems 406 from computing hardware 403 of the single computing device. In this way, computing hardware 403 can operate more efficiently, with lower power consumption, higher reliability, higher availability, higher utilization, greater flexibility, and lower cost than using separate computing devices.

Computing hardware 403 includes hardware and corresponding resources from one or more computing devices. For example, computing hardware 403 may include hardware from a single computing device (e.g., a single server) or from multiple computing devices (e.g., multiple servers), such as multiple computing devices in one or more data centers. As shown, computing hardware 403 may include one or more processors 407, one or more memories 408, one or more storage components 409, and/or one or more networking components 410. Examples of a processor, a memory, a storage component, and a networking component (e.g., a communication component) are described elsewhere herein.

The resource management component 404 includes a virtualization application (e.g., executing on hardware, such as computing hardware 403) capable of virtualizing computing hardware 403 to start, stop, and/or manage one or more virtual computing systems 406. For example, the resource management component 404 may include a hypervisor (e.g., a bare-metal or Type 1 hypervisor, a hosted or Type 2 hypervisor, or another type of hypervisor) or a virtual machine monitor, such as when the virtual computing systems 406 are virtual machines 411. Additionally, or alternatively, the resource management component 404 may include a container manager, such as when the virtual computing systems 406 are containers 412. In some implementations, the resource management component 404 executes within and/or in coordination with a host operating system 405.

A virtual computing system 406 includes a virtual environment that enables cloud-based execution of operations and/or processes described herein using computing hardware 403. As shown, a virtual computing system 406 may include a virtual machine 411, a container 412, or a hybrid environment 413 that includes a virtual machine and a container, among other examples. A virtual computing system 406 may execute one or more applications using a file system that includes binary files, software libraries, and/or other resources required to execute applications on a guest operating system (e.g., within the virtual computing system 406) or the host operating system 405.

Although the battery management system 401 may include one or more elements 403-413 of the cloud computing system 402, may execute within the cloud computing system 402, and/or may be hosted within the cloud computing system 402, in some implementations, the battery management system 401 may not be cloud-based (e.g., may be implemented outside of a cloud computing system) or may be partially cloud-based. For example, the battery management system 401 may include one or more devices that are not part of the cloud computing system 402, such as device 500 of FIG. 5, which may include a standalone server or another type of computing device. The battery management system 401 may perform one or more operations and/or processes described in more detail elsewhere herein.

Network 420 includes one or more wired and/or wireless networks. For example, network 420 may include a cellular network, a public land mobile network (PLMN), a local area network (LAN), a wide area network (WAN), a private network, the Internet, and/or a combination of these or other types of networks. The network 420 enables communication among the devices of environment 400.

The battery-powered device 430 may include includes one or more devices capable of receiving, generating, storing, processing, and/or providing information that permits the battery management system to monitor and/or determine the status of a battery of the battery-powered device 430, as described elsewhere herein. The battery-powered 430 may include a communication device and/or a computing device. For example, the battery-powered 430 may include a wireless communication device, a mobile phone, a user equipment, a laptop computer, a tablet computer, a desktop computer, a wearable communication device (e.g., a smart wristwatch, a pair of smart eyeglasses, a head mounted display, or a virtual reality headset), a sever device, or a similar type of device.

The user device 440 includes one or more devices capable of receiving, generating, storing, processing, and/or providing information associated with monitoring a battery status and/or a remaining useful life of a battery, as described elsewhere herein. The user device 440 may include a communication device and/or a computing device. For example, the user device 440 may include a wireless communication device, a mobile phone, a user equipment, a laptop computer, a tablet computer, a desktop computer, a wearable communication device (e.g., a smart wristwatch, a pair of smart eyeglasses, a head mounted display, or a virtual reality headset), or a similar type of device.

The maintenance system 450 includes one or more devices capable of receiving, generating, storing, processing, providing, and/or routing information associated with facilitating maintenance of a battery, as described elsewhere herein. The maintenance system 450 may include a communication device and/or a computing device. For example, the maintenance system 450 may include a server, such as an application server, a client server, a web server, a database server, a host server, a proxy server, a virtual server (e.g., executing on computing hardware), or a server in a cloud computing system. In some implementations, the maintenance system 450 includes computing hardware used in a cloud computing environment.

The number and arrangement of devices and networks shown in FIG. 4 are provided as an example. In practice, there may be additional devices and/or networks, fewer devices and/or networks, different devices and/or networks, or differently arranged devices and/or networks than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of environment 400 may perform one or more functions described as being performed by another set of devices of environment 400.

Figure 5:
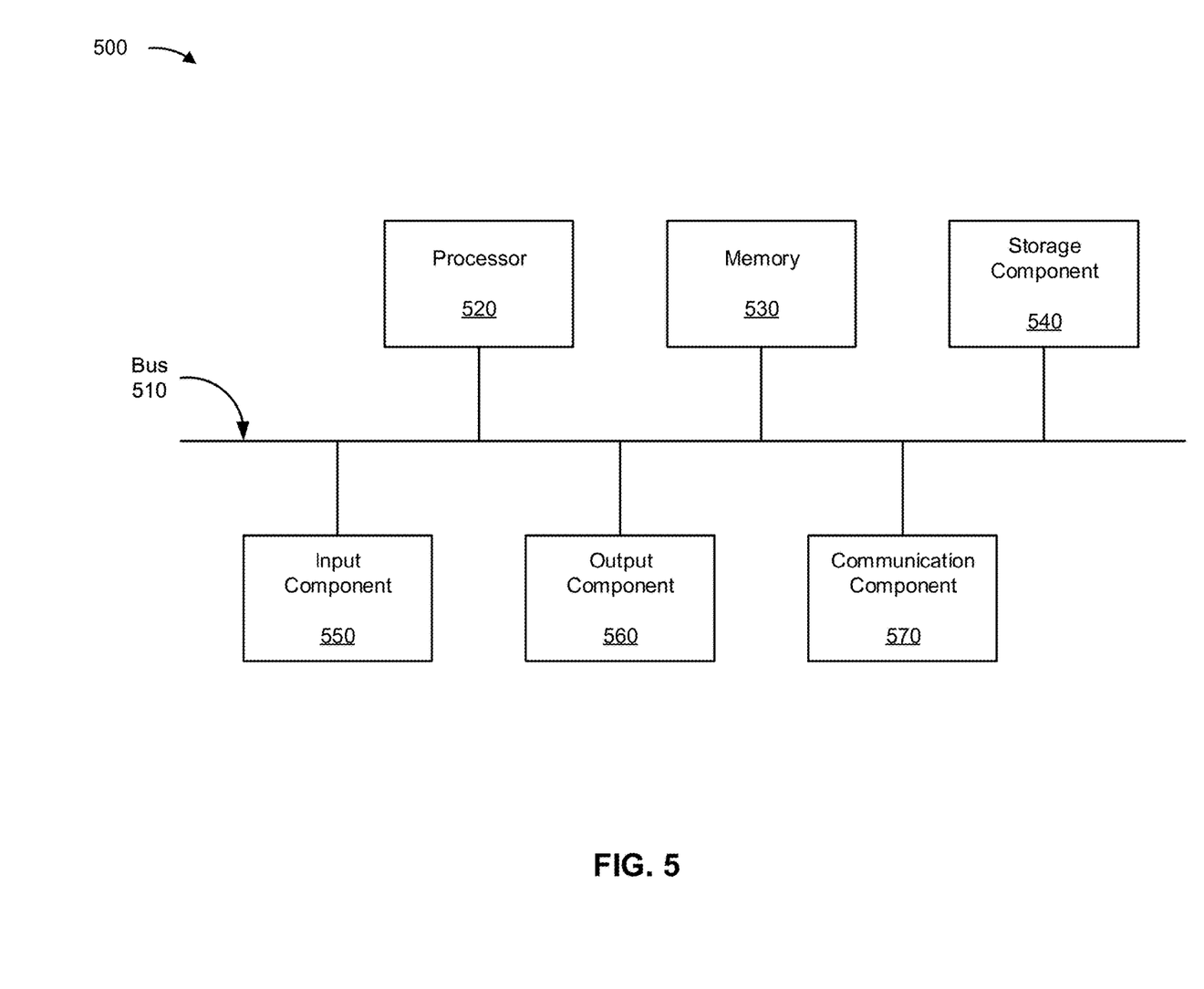
FIG. 5 is a diagram of example components of one or more devices of FIG. 4.

FIG. 5 is a diagram of example components of a device 500, which may correspond to the battery management system 401, the battery-powered device 430 and/or a battery pack of the battery-powered device 430, the user device 440, and/or the maintenance system 450. In some implementations, the battery management system 401, the battery-powered device 430, the user device 440, and/or the maintenance system 450 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
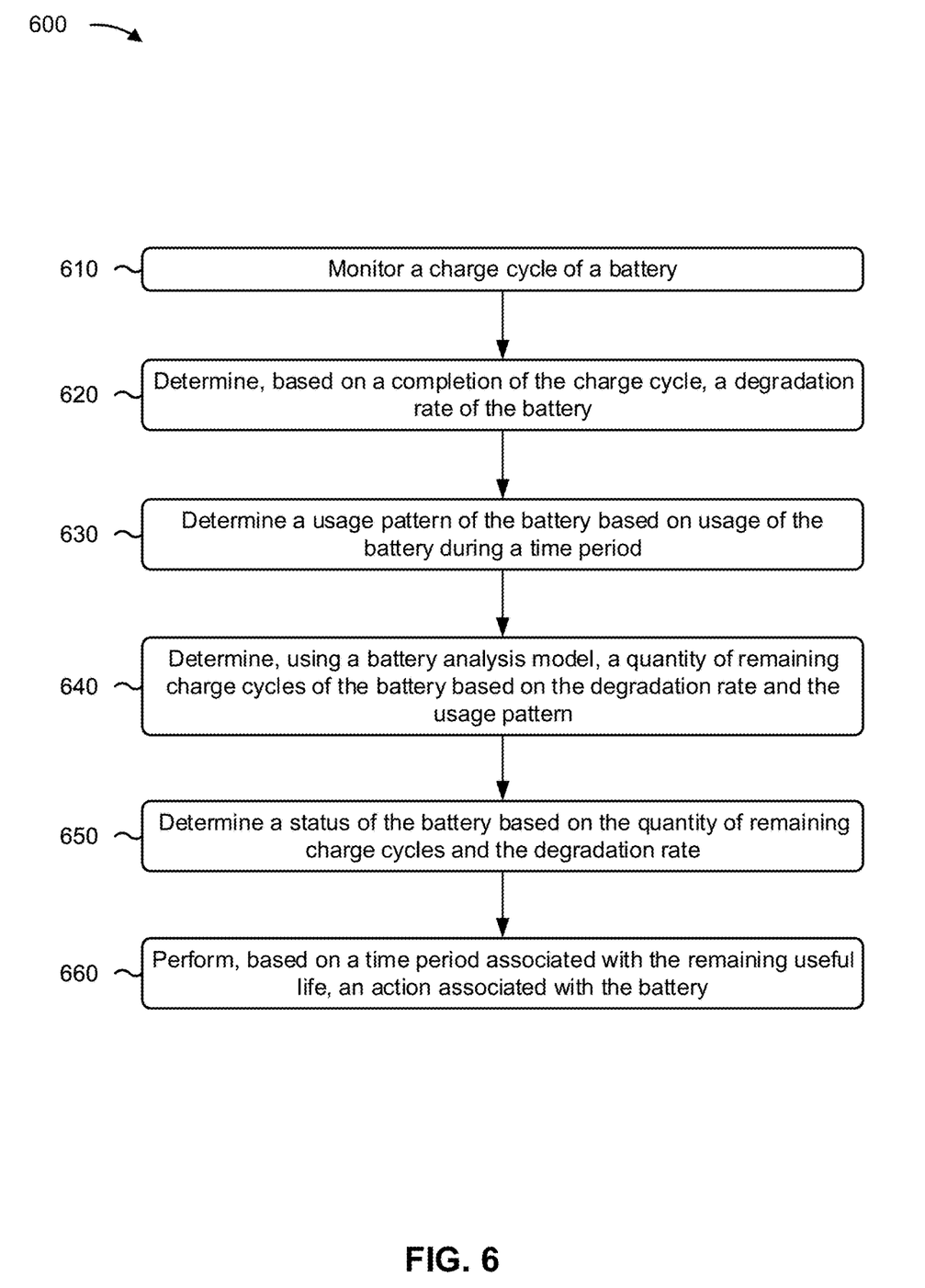
FIG. 6 is a flowchart of an example processes relating to a battery management system for monitoring a battery status.

FIG. 6 is a flowchart of an example process 600 associated with a battery management system for monitoring a battery status. In some implementations, one or more process blocks of FIG. 6 may be performed by a battery management system (e.g., battery management system 401). In some implementations, one or more process blocks of FIG. 6 may be performed by another device or a group of devices separate from or including the battery management system, such as a battery-powered device (e.g., the battery-powered device 430), a user device (e.g., the user device 440), and/or a maintenance system (e.g., the maintenance system 450). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include monitoring a charge cycle of a battery (block 610). For example, the battery management system may monitor a charge cycle of a battery, as described above. The battery management system may receive, from the battery, a charge count associated with the charge cycle.

As further shown in FIG. 6, process 600 may include determining, based on a completion of the charge cycle, a degradation rate of the battery (block 620). For example, the battery management system may determine, based on a completion of the charge cycle, a degradation rate of the battery, as described above.

The battery management system may detect the completion of the charge cycle based on the charge count indicating that the battery has been charged according to a rated capacity of the battery. In some implementations, the completion of the charge cycle is identified based on a counter of the battery indicating that a cumulative charge of the battery, during the charge cycle, has reached a rated capacity of the battery.

In some implementations, the battery management system may determine a health score of the battery at the completion of the charge cycle. The health score may be based on a rated capacity and a current charge capacity of the battery. Further, the battery management system may determine a previous health score associated with a previous charge cycle, and the previous health score may be based on the rated capacity and a previous charge capacity of the battery after a completion of the previous charge cycle. The battery management system may determine the degradation rate based on a difference between the previous health score and the health score.

As further shown in FIG. 6, process 600 may include determining a usage pattern of the battery based on usage of the battery during a time period (block 630). For example, the battery management system may determine a usage pattern of the battery based on usage of the battery during a time period, as described above.

As further shown in FIG. 6, process 600 may include determining, using a battery analysis model, a quantity of remaining charge cycles of the battery based on the degradation rate and the usage pattern (block 640). For example, the battery management system may determine, using a battery analysis model, a quantity of remaining charge cycles of the battery based on the degradation rate and the usage pattern, as described above. In some implementations, the battery analysis model may be trained based on historical data associated with historical usage of one or more other batteries. The one or more other batteries maybe associated with the battery based on the usage pattern having a threshold degree of similarity to historical patterns of the usage of the one or more other batteries, based on the battery and the one or more other batteries being used under a similar operating condition and/or based on the battery and the one or more other batteries being a same type.

As further shown in FIG. 6, process 600 may include determining a status of the battery based on the quantity of remaining charge cycles and the degradation rate; wherein the status is associated with a remaining useful life of the battery (block 650). For example, the battery management system may determine a status of the battery based on the quantity of remaining charge cycles and the degradation rate, as described above. In some implementations, the status may be associated with a remaining useful life of the battery.

As further shown in FIG. 6, process 600 may include performing, based on a time period associated with the remaining useful life, an action associated with the battery (block 660). For example, the battery management system may perform, based on a time period associated with the remaining useful life, an action associated with the battery, as described above.

In some implementations, when performing the action, the battery management system may generate a status report that indicates at least one of the remaining quantity of charge cycles, the usage pattern, and the time period associated with the remaining useful life. The battery management system may transmit the status report to a user device.

In some implementations, the battery management system may determine that the time period associated with the remaining useful life is below a threshold. In such a case, the battery management system may transmit, to a system device powered by the battery, instructions associated with adjusting the usage of the battery to extend the remaining useful life of the battery. Additionally, or alternatively, the battery management system may transmit, to the user device, an indication associated with the replacement of the battery. For example, the indication may indicate a schedule maintenance event associated with replacing the battery. Additionally, or alternatively, the indication may indicate that the battery is scheduled to be replaced by an individual and/or an automated device or machine.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In the foregoing disclosure, specific embodiments have been described. However, one of ordinary skill in the art will appreciate that various modifications and changes can be made without departing from the scope of the invention as set forth in the claims below. Accordingly, the specification and figures are to be regarded in an illustrative rather than a restrictive sense, and all such modifications are intended to be included within the scope of present disclosure. Additionally, the described embodiments/examples/implementations should not be interpreted as mutually exclusive, and should instead be understood as potentially combinable if such combinations are permissive in any way. In other words, any feature disclosed in any of the aforementioned examples or implementations may be included in any of the other aforementioned examples or implementations.

As used herein, the term "component" is intended to be broadly construed as hardware, firmware, and/or a combination of hardware and software. As used herein, each of the terms "tangible machine-readable medium," "non-transitory machine-readable medium" and "machine-readable storage device" is expressly defined as a storage medium (e.g., a platter of a hard disk drive, a digital versatile disc, a compact disc, flash memory, read-only memory, random-access memory, or the like) on which machine-readable instructions (e.g., code in the form of, for example, software and/or firmware) can be stored. The instructions may be stored for any suitable duration of time, such as permanently, for an extended period of time (e.g., while a program associated with the instructions is executing), or for a short period of time (e.g., while the instructions are cached, during a buffering process, or the like). Further, as used herein, each of the terms "tangible machine-readable medium," "non-transitory machine-readable medium" and "machine-readable storage device" is expressly defined to exclude propagating signals.

That is, as used in any claim herein, a "tangible machine-readable medium," a "non-transitory machine-readable medium," and a "machine-readable storage device," or the like, should not be interpreted as being implemented as a propagating signal.

As used herein, satisfying a threshold may, depending on the context, refer to a value being greater than the threshold, greater than or equal to the threshold, less than the threshold, less than or equal to the threshold, equal to the threshold, not equal to the threshold, or the like.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover, as used herein, relational terms such as first and second, top and bottom, or the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

The terms "a" and "an" are defined as one or more unless explicitly stated otherwise herein. Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, and c" is intended to cover a, b, c, a-b, a-c, b-c, and a-b-c, as well as any combination with multiple of the same item.

The abstract of the disclosure is provided to allow the reader to quickly ascertain the nature of the technical disclosure. It is submitted with the understanding that it will not be used to interpret or limit the scope or meaning of the claims. In addition, in the foregoing description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separately claimed subject matter.

What is claimed is:

1. A method for providing a status of a battery for a system, comprising:
   receiving, by a device, a charge count associated with a charge cycle of a battery;
   detecting, by the device, a completion of the charge cycle based on the charge count indicating that the battery has been charged according to a rated capacity of the battery;
   determining, by the device and based on detecting the completion of the charge cycle, a degradation rate of the battery relative to a previous charge cycle of the battery;
   determining, by the device, a usage pattern of the battery based on usage of the battery during a time period;
   training a machine learning model based on historical data associated with historical usage of one or more other batteries;
   determining, by the device and using the machine learning model, a quantity of remaining charge cycles of the battery based on the degradation rate and the usage pattern;
   determining, by the device, the status of the battery based on the quantity of remaining charge cycles and the degradation rate, the status being associated with a remaining useful life of the battery; and performing, based on a time period associated with the remaining useful life, an action associated with the battery, the action being at least one of adjusting the usage of the battery and replacing the battery.

2. The method of claim 1, wherein determining the degradation rate comprises:

determining a health score of the battery after the completion of the charge cycle;

determining a previous health score associated with the previous charge cycle; and determining the degradation rate based on:
   a difference between the previous health score and the health score, and
   a quantity of charge cycles that occurred between the charge cycle and the previous charge cycle.

3. The method of claim 2, wherein the health score is based on the rated capacity and a current charge capacity of the battery, and wherein the previous health score is based on the rated capacity and a previous charge capacity of the battery after a completion of the previous charge cycle.

4. The method of claim 1, wherein the one or more other batteries are associated with the battery based on at least one of:

the usage pattern having a threshold degree of similarity to historical patterns of the usage of the one or more other batteries;

the battery and the one or more other batteries being used under a similar operating condition; and the battery and the one or more other batteries being a same type.

5. The method of claim 1, further comprising transmitting, by the device and to a user device, the status of the battery to indicate the remaining useful life to a user, wherein transmitting the status comprises transmitting a status report that indicates the status of the battery, the status report identifying at least one of:

the remaining quantity of charge cycles, the usage pattern, and the remaining useful life.

6. The method of claim 1, further comprising:

determining that the time period associated with the remaining useful life is below a threshold; and transmitting, to a system device powered by the battery, instructions associated with adjusting the usage of the battery to extend the remaining useful life of the battery.

7. The method of claim 1, further comprising:

determining that the time period associated with the remaining useful life is below a threshold;

scheduling a replacement of the battery based on the time period; and transmitting, to the user device, an indication associated with the replacement of the battery.

8. A device, comprising:

one or more memories; and one or more processors, communicatively coupled to the one or more memories, causing the device to:

monitor a charge cycle of a battery;

determine, based on a completion of the charge cycle, a degradation rate of the battery;

determine a usage pattern of the battery based on usage of the battery during a time period;

train a machine learning model based on historical data associated with historical usage of one or more other batteries;

determine, using the machine learning model, a quantity of remaining charge cycles of the battery based on the degradation rate and the usage pattern;

determine a status of the battery based on the quantity of remaining charge cycles and the degradation rate, the status being associated with a remaining useful life of the battery; and perform, based on a time period associated with the remaining useful life, an action associated with the battery, the action being at least one of adjusting the usage of the battery, and replacing the battery.

9. The device of claim 8, wherein the one or more processors, when determining the degradation rate, cause the device to:

determine a health score of the battery at the completion of the charge cycle,
   wherein the health score is based on a rated capacity and a current charge capacity of the battery;

determine a previous health score associated with a previous charge cycle,
   wherein the previous health score is based on the rated capacity and a previous charge capacity of the battery after a completion of the previous charge cycle; and determine the degradation rate based on a difference between the previous health score and the health score.

10. The device of claim 8, wherein the completion of the charge cycle is identified based on a counter of the battery indicating that a cumulative charge of the battery, during the charge cycle, has reached a rated capacity of the battery.

11. The device of claim 8, wherein the one or more other batteries are associated with the battery based on:

the battery and the one or more other batteries being used under a similar operating condition, and the battery and the one or more other batteries being a same type.

12. The device of claim 8, wherein the one or more processors, when performing the action, further cause the device to:

generate a status report that indicates at least one of:
   the remaining quantity of charge cycles,
   the usage pattern, and
   the time period associated with the remaining useful life; and transmit the status report to a user device.

13. The device of claim 8, wherein the one or more processors, when performing the action, further cause the device to:

determine that the time period associated with the remaining useful life is below a threshold; and transmit, to a system device powered by the battery, instructions associated with adjusting the usage of the battery to extend the remaining useful life of the battery.

14. The device of claim 8, wherein the one or more processors, when performing the action, further cause the device to:

determine that the time period associated with the remaining useful life is below a threshold;

schedule a replacement of the battery based on the time period; and transmit, to a user device, an indication associated with the replacement of the battery.

15. A non-transitory tangible machine-readable medium storing a set of instructions, the set of instructions comprising:
one or more instructions that, when executed by one or more processors of a device, cause the device to:
generate a machine learning model based on historical data associated with historical usage of a plurality of batteries;
train the machine learning model using a machine learning technique;
monitor usage of a battery and charging of the battery, the battery being associated with one or more batteries of the plurality of batteries;
determine, after a completion of charge cycle, a degradation rate of the battery;
determine, based on the completion of the charge cycle, a usage pattern associated the usage of the battery during a time period;
cause the machine learning model to determine, based on the usage pattern and the degradation rate, a quantity of remaining charge cycles of the battery; and
perform an action based on the quantity of remaining charge cycles, wherein the action is replacing the battery.

16. The non-transitory tangible machine-readable medium of claim 15, wherein the degradation rate corresponds to a reduction in a health score of the battery during a time period that is between the charge cycle of the battery and a previous charge cycle of the battery.

17. The non-transitory tangible machine-readable medium of claim 15, wherein the completion of the charge cycle is identified based on a counter of the battery indicating that a cumulative charge of the battery, during the charge cycle, is greater than or equal to a rated capacity of the battery.

18. The non-transitory tangible machine-readable medium of claim 15, wherein the historical data indicates historical operating conditions of the historical usage of the one or more batteries of the plurality of batteries, and wherein the one or more batteries are associated with the battery based on the battery being used under an operating condition that is similar to one or more of the historical operating conditions.

19. The non-transitory tangible machine-readable medium of claim 15,
wherein the one or more instructions, that cause the device to perform the action, further cause the device to:
determine, based on the quantity of remaining charge cycles and the usage pattern, a time period associated with a remaining useful life of the battery;
determine that a duration of the time period is below a threshold; and
transmit a notification to a user device that indicates that the duration of the time period is below the threshold.

20. The non-transitory tangible machine-readable medium of claim 15, wherein the one or more instructions, that cause the device to perform the action, cause the device to at least one of:
transmit, to a user device, a status report that identifies the quantity of remaining charge cycles;
schedule, based on the quantity of remaining charge cycles being below a threshold, the replacement of the battery within a system device receiving power from the battery; and
cause, based on the remaining charge cycles being below a threshold, the system device to adjust usage of the battery relative to the usage pattern.

* * * * *